United States Patent
Huff

(10) Patent No.: US 9,055,664 B1
(45) Date of Patent: Jun. 9, 2015

(54) TOOL FOR REMOVING A SMOKE DETECTOR COVER

(71) Applicant: Larry J. Huff, Tacoma, WA (US)

(72) Inventor: Larry J. Huff, Tacoma, WA (US)

(*) Notice: Subject to any disclaimer, the term of this patent is extended or adjusted under 35 U.S.C. 154(b) by 205 days.

(21) Appl. No.: 13/796,846

(22) Filed: Mar. 12, 2013

(51) Int. Cl.
| | |
|---|---|
| H02G 3/20 | (2006.01) |
| G08B 17/10 | (2006.01) |
| G08B 17/00 | (2006.01) |
| G08B 17/06 | (2006.01) |
| H02G 3/38 | (2006.01) |
| H01R 13/46 | (2006.01) |
| H05K 5/00 | (2006.01) |
| H01R 13/502 | (2006.01) |
| H05K 7/00 | (2006.01) |

(52) U.S. Cl.
CPC .............. *H05K 5/0013* (2013.01); *G08B 17/10* (2013.01); *G08B 17/00* (2013.01); *G08B 17/06* (2013.01); *H02G 3/281* (2013.01)

(58) Field of Classification Search
CPC ........ H02G 3/281; G08B 17/10; G08B 17/00; G08B 17/06
USPC ............ 361/729, 730, 732, 747; 174/491, 50, 174/520, 559, 560, 561, 562, 563; 73/431; 250/381, 385.1; 340/628
See application file for complete search history.

(56) References Cited

U.S. PATENT DOCUMENTS

| | | | |
|---|---|---|---|
| 3,767,917 A | * 10/1973 | Lampart et al. | ............... 250/384 |
| 3,900,795 A | 8/1975 | Larsen | |
| 6,591,716 B2 | 7/2003 | Wantz | |
| 6,672,636 B2 | 1/2004 | Kelly | |
| D518,341 S | 4/2006 | Lowen | |
| D519,338 S | 4/2006 | Lowen | |
| D558,549 S | 1/2008 | Ozaki-Owen | |

* cited by examiner

*Primary Examiner* — Hoa C Nguyen
*Assistant Examiner* — Binh Tran
(74) *Attorney, Agent, or Firm* — Kyle A. Fletcher, Esq.

(57) ABSTRACT

The tool for removing a smoke detector cover is a set of housings that are biased away from one another, and which when pressed together shall engage release posts against the locking tabs of an existing base plate of an existing smoke detector in order to release a cover of the smoke detector. The upper housing and the lower housing collectively mount between a wall surface or ceiling surface and the base plate of the smoke detector. Upon pressing the upper housing towards the lower housing, the release posts shall act in concert to push all lock tabs of the base plate outwardly thereby releasing the cover from the smoke detector.

13 Claims, 4 Drawing Sheets

TOOL FOR REMOVING A SMOKE DETECTOR COVER

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

A. Field of the Invention

The present invention relates to the field of smoke detectors, and more specifically, a tool that aids in removing the case of a smoke detector in order to clean or repair the smoke detector quickly.

Smoke detectors and/or fire detectors and/or carbon monoxide detectors are required in public buildings. In such a location it is required to periodically remove the cover of the smoke detector in order to clean and inspect the smoke detector. The covers of smoke detectors have a series of tabs that have to be simultaneously released in order for the cover to be disengaged. This process can be difficult and timely to accomplish, especially where the cover is in a hard to reach location, such as on a ceiling.

The device of the present application seeks to overcome this problem by providing a tool that quickly enables a cover to be removed in order for the smoke detector to be inspected and cleaned.

B. Discussion of the Prior Art

As will be discussed immediately below, no prior art discloses a tool that works to quickly and easily disengage a cover of a smoke detector such that the smoke detect is able to be cleaned and or inspected; wherein the tool is comprised of an upper housing and a lower housing that collectively mount between a wall surface or ceiling surface and the base plate of the smoke detector; wherein the upper housing is biased away from the lower housing via at least one spring; whereupon pressing upper housing towards the lower housing shall engage release posts that act in concert to push outwardly the lock tabs of the base plate of the smoke detector, and which shall release or unlock the cover of the smoke detector therefrom; wherein the lower housing includes the release posts, which align with holes provided in the upper housing and through which the release posts align and correspond with all applicable lock tabs of the base plate of the smoke detector; wherein the tool simply requires gently pressing the upper housing towards the lower housing in order to disengage the cover with respect to the base plate of the smoke detector.

The Wantz Patent (U.S. Pat. No. 6,591,716) discloses a tool for use in unlatching and removing the cover of a smoke or fire detecting apparatus. However, the tool does not support the fire detecting apparatus against the mounting surface at all times, but rather relies on the base plate of the fire detecting apparatus to support itself to the mounting surface.

The Lowen Patents (U.S. Patent No. Des. 518,341 and Des. 519,338) each illustrate an ornamental design for a tool that can quickly depress the locking tabs on a smoke detector for removal. Again, the tool is used to release tabs, and does not further support the smoke detector against a mounting surface.

The Ozaki-Owen Patent (U.S. Patent No. Des. 558,549) illustrates a design for a tool to grip onto and remove a smoke detector. Again, the tool is used to remove a smoke detector, and does not further support the smoke detector against a mounting surface or to release a cover from a base plate.

The Larsen et al. Patent (U.S. Pat. No. 3,900,795) discloses an inspection and test tool for use with a smoke alarm in which the device can easily remove the face plate of the alarm. Again, the tool does not support the smoke alarm against the mounting surface, and easily release the cover from a base plate upon pushing housings of the tool together.

The Kelly Patent (U.S. Pat. No. 6,672,636) discloses a tool for easily and quickly unlocking and removing the cover or entire unit of a smoke detector. Again, the tool does not support the smoke detector to the mounting surface by mounting between the smoke detector and the mounting surface.

While the above-described devices fulfill their respective and particular objects and requirements, they do not describe a tool that works to quickly and easily disengage a cover of a smoke detector such that the smoke detect is able to be cleaned and or inspected; wherein the tool is comprised of an upper housing and a lower housing that collectively mount between a wall surface or ceiling surface and the base plate of the smoke detector; wherein the upper housing is biased away from the lower housing via at least one spring; whereupon pressing upper housing towards the lower housing shall engage release posts that act in concert to push outwardly the lock tabs of the base plate of the smoke detector, and which shall release or unlock the cover of the smoke detector therefrom; wherein the lower housing includes the release posts, which align with holes provided in the upper housing and through which the release posts align and correspond with all applicable lock tabs of the base plate of the smoke detector; wherein the tool simply requires gently pressing the upper housing towards the lower housing in order to disengage the cover with respect to the base plate of the smoke detector. In this regard, the tool for removing a smoke detector cover departs from the conventional concepts and designs of the prior art.

SUMMARY OF THE INVENTION

The tool for removing a smoke detector cover is a set of housings that are biased away from one another, and which when pressed together shall engage release posts against the locking tabs of an existing base plate of an existing smoke detector in order to release a cover of the smoke detector. The upper housing and the lower housing collectively mount between a wall surface or ceiling surface and the base plate of the smoke detector. Upon pressing the upper housing towards the lower housing, the release posts shall act in concert to rotate all lock tabs of the base plate inwardly thereby releasing the cover from the smoke detector. The lower housing includes the release posts, which align with holes provided in the upper housing and through which the release posts align and correspond with all applicable lock tabs of the base plate of the smoke detector. The upper housing is sandwiched between the lower housing and the base plate of the smoke detector. The tool simply requires gently pressing the upper housing towards the lower housing in order to disengage the cover with respect to the base plate of the smoke detector.

It is an object of the invention to provide a tool that is specially adapted for use between the mounting surface and the base plate of a smoke detector, and which easily releases the cover with respect to the base plate of the smoke detector such that the smoke detector may be inspected and/or cleaned as needed.

A further object of the invention is to provide a tool that is comprised of an upper housing that is biased away from a lower housing, and which when pressed together shall push all lock tabs of the base plate outwardly thereby releasing the cover.

A further object of the invention is to provide a spring that is positioned between the upper housing and the lower housing, and which shall bias the housings away from one another.

A further object of the invention is to include release posts that are vertically oriented with respect to the lower housing, and which align with holes in the upper housing such that when the upper housing is pressed towards the lower housing the release posts shall extend through said holes and push the lock tabs outwardly on the base plate.

Another object of the invention is to have the tool support the smoke detector against the mounting surface, and be operably engaged to release the cover upon pushing the upper housing towards the lower housing.

These together with additional objects, features and advantages of the tool for removing a smoke detector cover will be readily apparent to those of ordinary skill in the art upon reading the following detailed description of presently preferred, but nonetheless illustrative, embodiments of the tool for removing a smoke detector cover when taken in conjunction with the accompanying drawings.

In this respect, before explaining the current embodiments of the tool for removing a smoke detector cover in detail, it is to be understood that the tool for removing a smoke detector cover is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the tool for removing a smoke detector cover.

It is therefore important that the claims be regarded as including such equivalent construction insofar as they do not depart from the spirit and scope of the tool for removing a smoke detector cover. It is also to be understood that the phraseology and terminology employed herein are for purposes of description and should not be regarded as limiting.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENT

Figure 1:
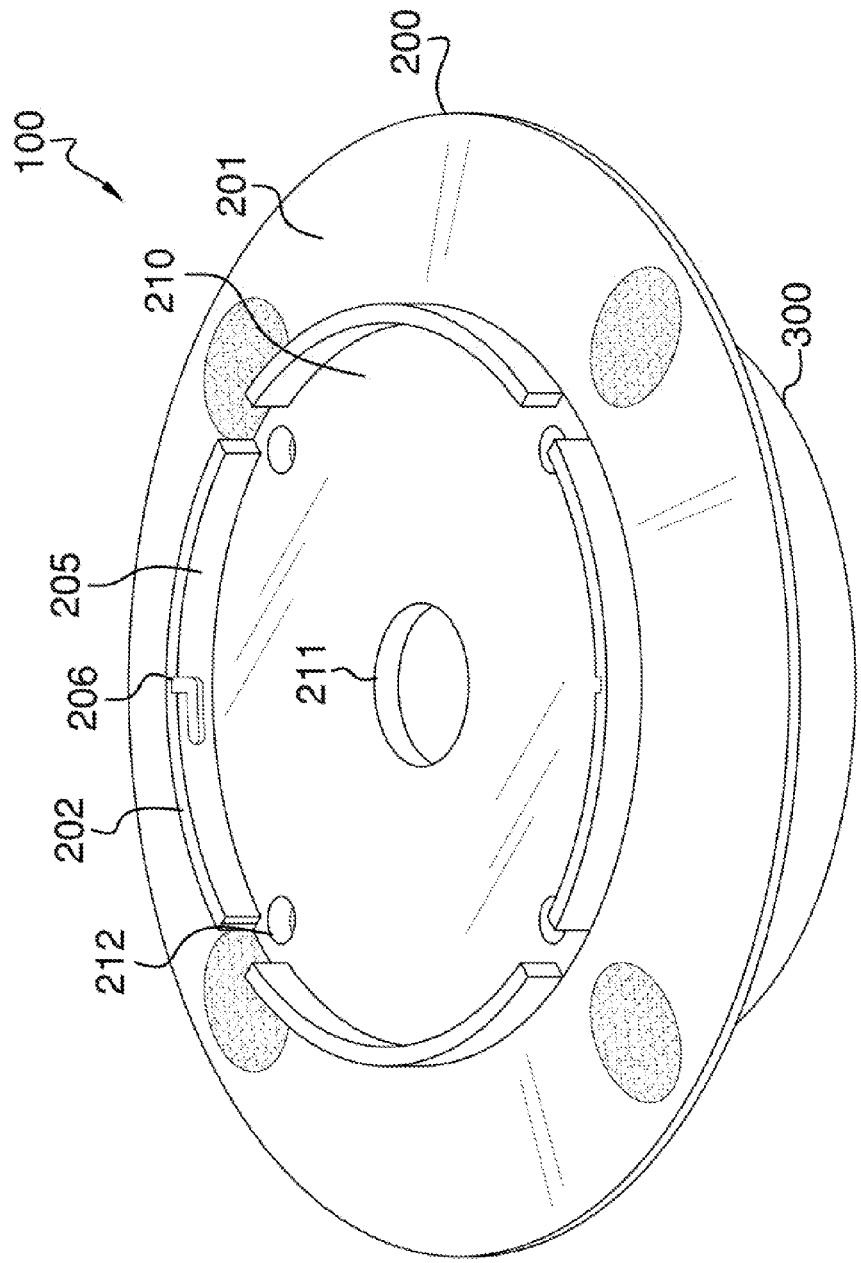
FIG. 1 illustrates a perspective view of the tool by itself.
Figure 2:
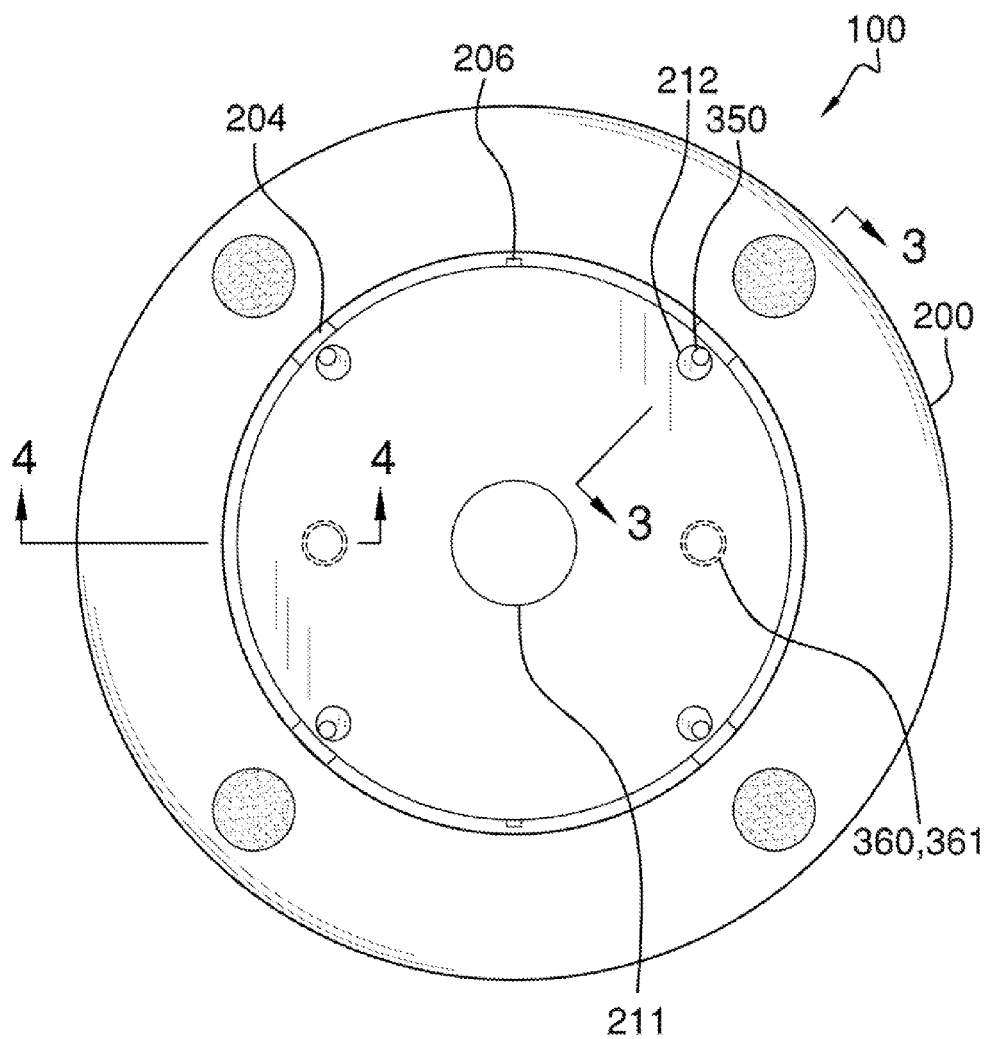
FIG. 2 illustrates a top view of the tool by itself.

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Detailed reference will now be made to the preferred embodiment of the present invention, examples of which are illustrated in FIGS. 1-5. A tool for removing a smoke detector cover 100 (hereinafter invention) includes an upper housing 200 and a lower housing 300.

The upper housing 200 is a circular object that includes a sloped portion 201 defining an outer perimeter. The upper housing 200 includes a first wall 202 that extends a first height 203. The first wall 202 includes several openings 204 that are equally spaced in order to form quadrants. The first wall 202 also includes an inner surface 205 that includes at least one notched groove 206 thereon. The first wall 202 is an important component of the upper housing 200 and the invention 100 in that the first wall 202 supports a base plate 501 of a smoke detector 500. Moreover, the notched groove 206 provides the means with which to lock the base plate 501 to the upper housing 200.

The base plate 501 when installed shall rest against an upper surface 210 of the upper housing 200. The upper surface 210, like the first wall 202 and the sloped portion 201, is circular in shape, and includes a first circle 211 centrally located thereon and surrounded by a plurality of second circles 212. The second circles 212 may or may not be smaller in diameter when compared with the first circle 211.

Figure 3:
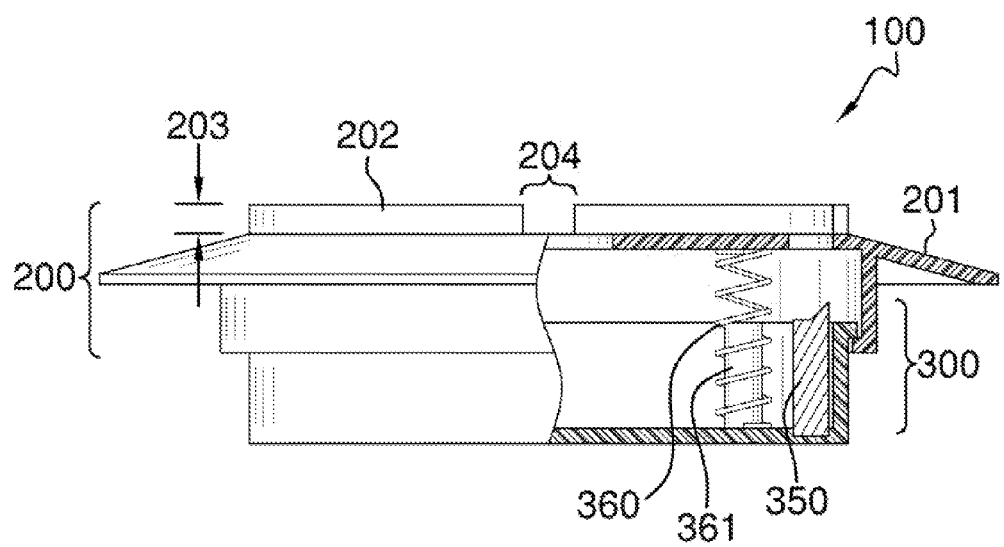
FIG. 3 illustrates a cross-sectional view along line 3-3 in FIG. 2, and depicting the spring and a release post located inside of the tool.
Figure 4:
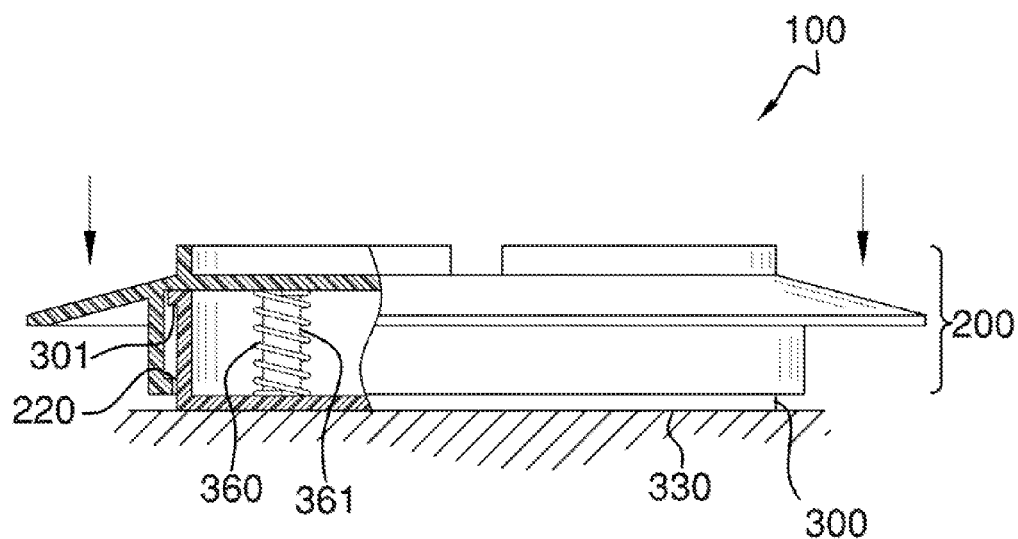
FIG. 4 illustrates another cross-sectional view along line 4-4 in FIG. 2, and detailing the upper housing being pressed downwardly towards the lower housing.
Figure 5:
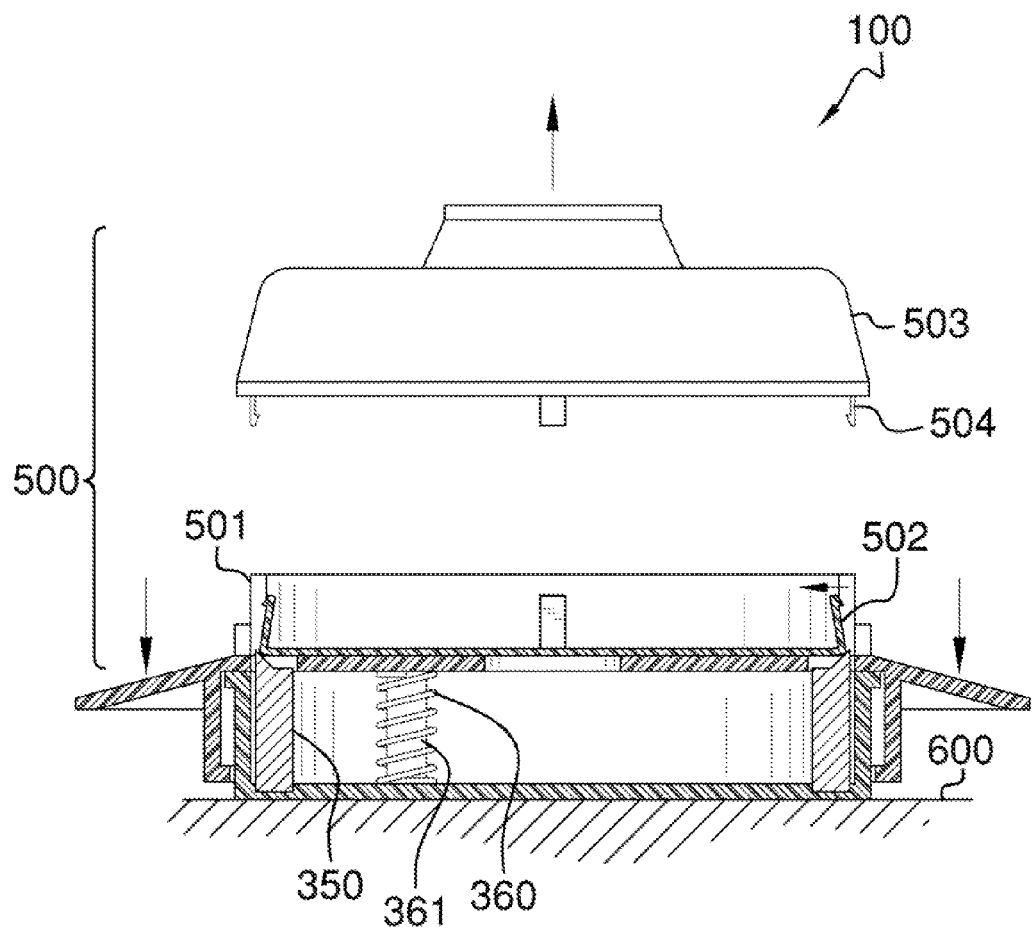
FIG. 5 illustrates a cross-sectional view of the tool in use with a base plate and cover of a smoke detector, and further depicting the release posts pushing the lock tabs outwardly in order for the cover to be released therefrom.

The lower housing 300 is a circular object that is designed to work in conjunction with the upper housing 200. Referring to FIGS. 3-5, the lower housing 300 includes a lower lip 301 that engages an upper lip 220 of the upper housing 200. Moreover, the upper lip 220 is located under the curved portion 201 of the upper housing 200. The lower lip 301 and the upper lip 220 correspond with one another to insure that the upper housing 200 can move relative the lower housing 300, and which will further prevent unintended separation of the housings, respectively. It shall be duly noted that the lower lip 301 is extending outwardly whereas the upper lip 220 is extending inwardly, and which shall be a requirement for the upper housing 200 to move relative the lower housing 300.

The invention 100 includes a cavity 400 formed between the upper housing 200 and the lower housing 400. The cavity 400 is otherwise enclosed, and is where a plurality of release posts 350 are provided as well as spring 360 and spring guides 361. The lower housing 300 includes spring guides 361 that extend vertically therefrom, and which include springs 360 there around. The springs 360 bias the upper housing 200 away from the lower housing 300 (see FIGS. 3-4). The lower housing 300 also includes the release posts 350, which also extends vertically with respect to the lower housing 300.

The release posts 350 are an important part of the overall function of the invention 100 in that the release posts 350 are aligned with and extend through the second circles 212 of the upper housing 200 when the upper housing 200 is pushed towards the lower housing 300. When the release posts 350 extend through the second circles 212, the release posts 350 have are adapted to engage against and rotate inwardly all locking tabs 502 of the base plate 501. When the locking tabs 502 of the base plate 501 are pushed outwardly, a cover 503 of the smoke detector 500 is released there from. More specifically, the cover 503 has release tabs 504 that align with and correspond to the locking tabs 502.

The principle function of the invention 100 is that upon pressing the upper housing 200 towards the lower housing 300, the release posts 350 shall push outwardly the locking tabs 502 of the base plate 501 in order for the release tabs 504 of the cover 503 to be dis-engaged therewith so that the cover 503 is easily released from the base plate 501.

The lower housing 300 is further defined with a lower mounting surface 330 that is to be placed against the mounting surface 600. It shall be noted that the invention 100 is configured for use in between the smoke detector 500 and the mounting surface 600. It shall be noted that the term smoke detector 500 may be used to refer to a fire alarm, smoke alarm, carbon monoxide alarm, etc. It shall be further noted that the term mounting surface 600 shall be used to refer to any surface, and which may be a wall surface, ceiling surface, or other surface with which the smoke detector 500 would otherwise be mounted against or rested upon.

With respect to the above description, it is to be realized that the optimum dimensional relationship for the various components of the invention 100, to include variations in size, materials, shape, form, function, and the manner of operation, assembly and use, are deemed readily apparent and obvious to one skilled in the art, and all equivalent relationships to those illustrated in the drawings and described in the specification are intended to be encompassed by the invention 100.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

The inventor claims:

1. A tool for removing a smoke detector cover comprising:
    an upper housing and a lower housing that are slideably engaged with respect to one another, and which are biased against one another;
    wherein upon pushing the upper housing towards the lower housing release posts are configured to engage against and push outwardly all locking tabs of a base plate of a smoke detector in order for said locking tabs to unlock all corresponding release tabs of a cover of said smoke detector;
    wherein the upper housing is further defined as a circular object that includes a sloped portion defining an outer perimeter; wherein the upper housing includes a first wall that extends a first height;
    wherein the first wall is further defined with an inner surface that includes at least one notched groove thereon; wherein the notched groove and first wall lock and secure the base plate of the smoke detector thereto.

2. The tool for removing a smoke detector cover as described in claim 1 wherein the base plate of the smoke detector shall rest against an upper surface of the upper housing when installed thereto; wherein the upper surface includes a first circle centrally located thereon and surrounded by a plurality of second circles; wherein the second circles align with and correspond to the release posts such that when the upper housing is pushed towards the lower housing, the release posts shall extend through the second holes and engage the locking tabs of the base plate of the smoke detector.

3. The tool for removing a smoke detector cover as described in claim 2 wherein the second circles are smaller in diameter when compared with the first circle.

4. The tool for removing a smoke detector cover as described in claim 2 wherein the lower housing includes a lower lip that engages an upper lip of the upper housing; wherein the upper lip is located under the curved portion of the upper housing; wherein the lower lip and the upper lip correspond with one another to insure that the upper housing can move relative the lower housing.

5. The tool for removing a smoke detector cover as described in claim 4 wherein the lower lip extends outwardly whereas the upper lip extends inwardly.

6. The tool for removing a smoke detector cover as described in claim 4 wherein the upper housing and the lower housing form a cavity there between; wherein the release posts and springs are situated within the cavity; wherein the lower housing includes spring guides that extend vertically therefrom, and which includes the springs there around; wherein the springs bias the upper housing away from the lower housing.

7. The tool for removing a smoke detector cover as described in claim 1 wherein the lower housing is further defined with a lower mounting surface that it is configured to be placed against a mounting surface in order to support the smoke detector therefrom.

8. A tool for removing a smoke detector cover comprising:
    an upper housing and a lower housing that are slideably engaged with respect to one another, and which are biased against one another;
    wherein upon pushing the upper housing towards the lower housing release posts are configured to engage against and push outwardly all locking tabs of a base plate of a smoke detector in order for said locking tabs to unlock all corresponding release tabs of a cover of said smoke detector;
    wherein the lower housing is further defined with a lower mounting surface that it is configured to be placed against a mounting surface in order to support the smoke detector therefrom;
    wherein the upper housing is further defined as a circular object that includes a sloped portion defining an outer perimeter; wherein the upper housing includes a first wall that extends a first height;
    wherein the first wall is further defined with an inner surface that includes at least one notched groove thereon; wherein the notched groove and first wall lock and secure the base plate of the smoke detector thereto.

9. The tool for removing a smoke detector cover as described in claim 8 wherein the base plate of the smoke detector shall rest against an upper surface of the upper housing when installed thereto; wherein the upper surface includes a first circle centrally located thereon and surrounded by a plurality of second circles; wherein the second circles align with and correspond to the release posts such that when the upper housing is pushed towards the lower housing, the release posts shall extend through the second holes and engage the locking tabs of the base plate of the smoke detector.

10. The tool for removing a smoke detector cover as described in claim 9 wherein the second circles are smaller in diameter when compared with the first circle.

11. The tool for removing a smoke detector cover as described in claim 10 wherein the lower housing includes a lower lip that engages an upper lip of the upper housing; wherein the upper lip is located under the curved portion of the upper housing; wherein the lower lip and the upper lip correspond with one another to insure that the upper housing can move relative the lower housing.

12. The tool for removing a smoke detector cover as described in claim 11 wherein the lower lip extends outwardly whereas the upper lip extends inwardly.

13. The tool for removing a smoke detector cover as described in claim 12 wherein the upper housing and the lower housing form a cavity there between; wherein the release posts and springs are situated within the cavity; wherein the lower housing includes spring guides that extend vertically therefrom, and which includes the springs there around; wherein the springs bias the upper housing away from the lower housing.

\* \* \* \* \*